(12) United States Patent
Shiramizu et al.

(10) Patent No.: US 7,771,205 B2
(45) Date of Patent: Aug. 10, 2010

(54) WIRING BOARD AND OPTICAL DISK DRIVE USING THE SAME

(75) Inventors: Takahisa Shiramizu, Kumamoto (JP); Yoshinobu Soeda, Kumamoto (JP); Masaomi Inoue, Fukuoka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/404,555

(22) Filed: Mar. 16, 2009

(65) Prior Publication Data
US 2009/0233459 A1 Sep. 17, 2009

(30) Foreign Application Priority Data
Mar. 17, 2008 (JP) .............................. 2008-067530

(51) Int. Cl.
*H01R 12/00* (2006.01)
(52) U.S. Cl. ........................................ 439/60
(58) Field of Classification Search .................... 439/60, 439/924.1, 181
See application file for complete search history.

(56) References Cited

U.S. PATENT DOCUMENTS

| | | | | |
|---|---|---|---|---|
| 3,396,461 A | * | 8/1968 | Spooner et al. ................ | 29/827 |
| 4,736,275 A | * | 4/1988 | Kendall et al. ............... | 361/767 |
| 4,849,944 A | * | 7/1989 | Matsushita ................... | 714/718 |
| 5,575,575 A | * | 11/1996 | Ide et al. ...................... | 400/185 |
| 5,659,951 A | * | 8/1997 | Gall et al. ...................... | 29/830 |
| 5,772,448 A | * | 6/1998 | Ekrot et al. .................... | 439/60 |
| 5,865,631 A | * | 2/1999 | Berto et al. .................... | 439/59 |
| 6,007,389 A | * | 12/1999 | Weber .......................... | 439/857 |
| 6,234,807 B1 | * | 5/2001 | Amini et al. ................... | 439/60 |
| 6,767,252 B2 | * | 7/2004 | McGrath et al. ............. | 439/637 |
| 7,186,150 B1 | * | 3/2007 | Boone .......................... | 439/680 |
| 7,344,085 B2 | * | 3/2008 | Rossi .......................... | 235/486 |
| 7,455,531 B2 | * | 11/2008 | Hirabayashi et al. .......... | 439/67 |
| 7,497,735 B2 | * | 3/2009 | Belopolsky .................. | 439/511 |
| 2002/0017963 A1 | * | 2/2002 | Shimamoto et al. ............ | 333/1 |
| 2007/0279805 A1 | * | 12/2007 | Komura et al. ........... | 360/245.9 |

FOREIGN PATENT DOCUMENTS

| | | |
|---|---|---|
| JP | 61-74971 | 5/1986 |
| JP | 4-15872 | 2/1992 |

* cited by examiner

*Primary Examiner*—T C Patel
*Assistant Examiner*—Vladimir Imas
(74) *Attorney, Agent, or Firm*—Greenblum & Bernstein P.L.C.

(57) ABSTRACT

A wiring board of the present invention has a terminal section and a wiring section connected to the terminal section. The terminal section is configured so as to have a plurality of long connection terminals placed at predetermined intervals along a direction orthogonal to a direction in which the wiring board is to be inserted; and short connection terminals arranged between adjacent long connection terminals so as to be located behind the respective long connection terminals with respect to the direction of insertion. At least one adjacent pair consisting of a long connection terminal and a short connection terminal is short-circuited, and the length of the thus-short-circuited short connection terminal is made shorter than non-short-circuit short connection terminals.

7 Claims, 10 Drawing Sheets

WIRING BOARD AND OPTICAL DISK DRIVE USING THE SAME

BACKGROUND

1. Field of the Invention

The present invention relates to an electrode structure of a wiring board that is connected to a connector; more particularly, to a connection terminal structure of a wiring board that enables prevention of occurrence of faulty insert connections to a connector and an optical disk drive using the structure.

2. Description of the Related Art

With recent functional advances in and miniaturization of electronic devices, electronic circuits arranged in the electronic devices also become further miniaturized and packaged at higher densities, as a result of which faulty connections attributable to a decrease in pitch between connectors of an electronic circuit component and connection terminals of a wiring board electrode raise a problem. For this reason, there is utilized a so-called staggered wiring technique for alternately displacing horizontally-arranged electrodes such that one electrode becomes in advance or behind an adjacent electrode, thereby assuring an area of a connection section and reduce electrical resistance. An example technique for enabling superior electrical conduction by reducing electrical resistance of a connection section between such an electrode and a connector terminal and making stable a connection between a wiring pattern and an electronic component is JPH04-15872(U).

In order to cause a device, such as an optical disk drive, to properly operate, a connection between a wiring board and a connector must be made stable at all times. In short, if the reliability of a connection between a wiring board and a connector becomes low for reasons of unfinished insertion or inclined insertion, the device will not become able to operate properly. A document (JP61-74971(U)) describes, as means for solving the problem, a technique for monitoring a state of disconnection between a wiring board and a connector, by making two specific connection terminals on the wiring board shorter than the other connection terminals and short-circuiting the two connection terminals.

Figure 2:
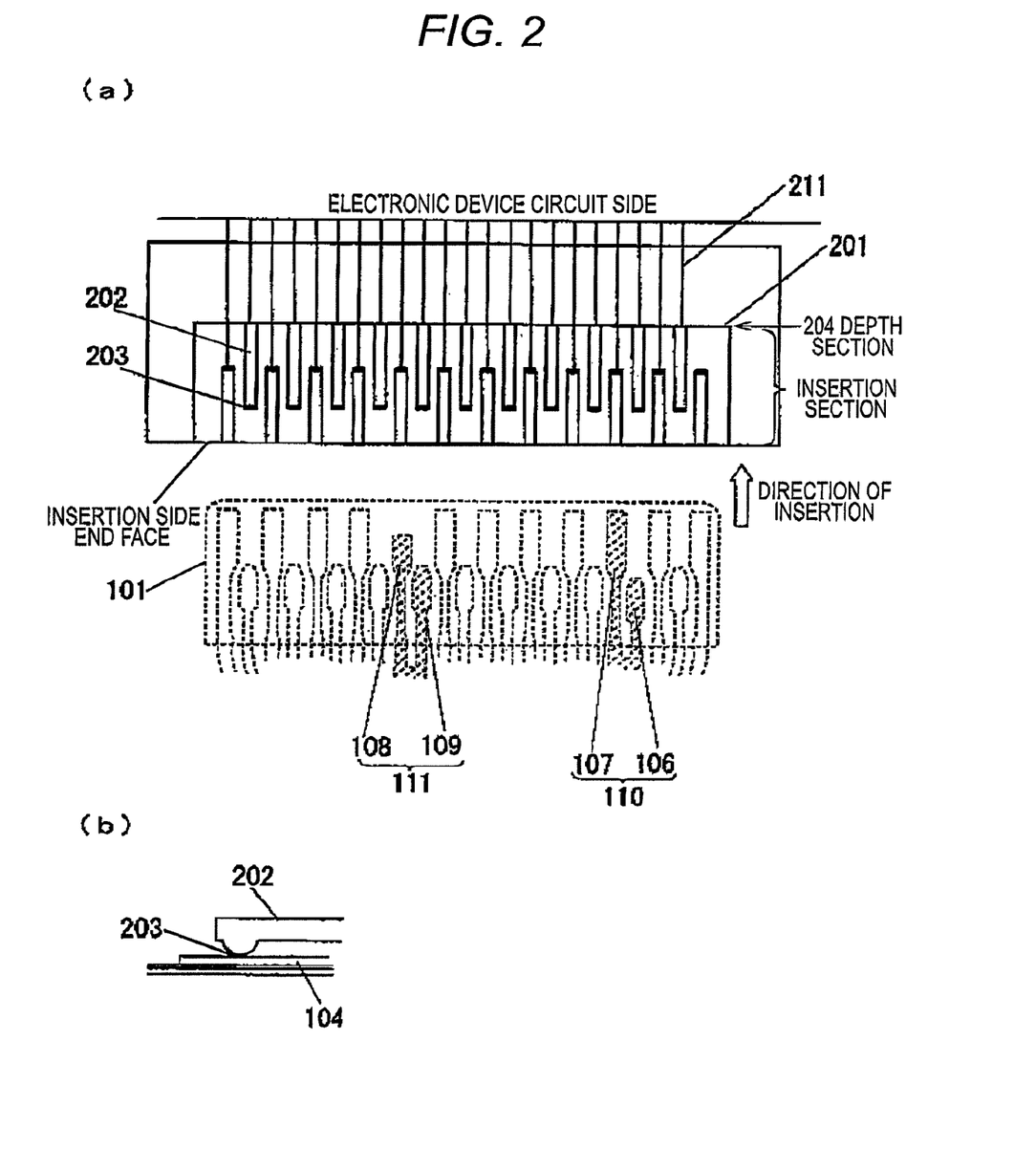
FIG. 2 is a schematic view of a connector terminal to which the wiring board of the embodiment of the present invention is connected.

However, according to the technique, it is possible to detect unfinished insertion of the connector to the wiring board but impossible to detect incomplete connection, such as inclined insertion (FIG. 2). Moreover, according to the technique disclosed in FIG. 3, it is possible to detect a state of inclined insertion. However, the connection terminals at both ends are short-circuited, and hence wiring becomes complicate. Further, although the wiring board and the connector are found to be in a state of unfinished insertion, it is impossible to determine whether the wiring board is upwardly inclined, downwardly inclined, or merely deficient in insertion without inclination. Hence, appropriate processing cannot be performed to assure a state of normal connection during the course of manufacture. In particular, a problem arises in a compact optical drive unit, such as a small-diameter drive unit.

SUMMARY

The present invention solves the problem and aims at providing a wiring board that enables detection of an incompletely-connected state attributable to inclined insertion of electrodes on a wiring board to connector terminals, which would arise when the wiring board is inserted into the connector, without involvement of complication of wiring on a wiring board, thereby detecting occurrence of faulty connection, and that enables detection of the nature of an incompletely-inserted state, as well as providing an optical disk drive using the wiring board.

To achieve the objective, the present invention provides a wiring board connected to a connector through insertion, comprising a plurality of connection terminals arranged at predetermined intervals on the wiring board and that are electrically connected to electrodes of the connector corresponding to the respective connection terminals when the wiring board is inserted into the connector. At least two first connection terminals of the plurality of connection terminals are made smaller than other second connection terminals, and the length of the first connection terminal is determined so as not to contact the corresponding electrode when the wiring board and the connector are not normally connected. The first connection terminal and the adjacent second connection terminal are short-circuited, and at least a pair of connection terminals made up of the short-circuited first connection terminal and the short-circuited second connection terminal are arranged with a center of the wiring board sandwiched therebetween.

DETAILED DESCRIPTION

The best mode for practicing the present invention will be described by reference to the drawings.

Figure 1:
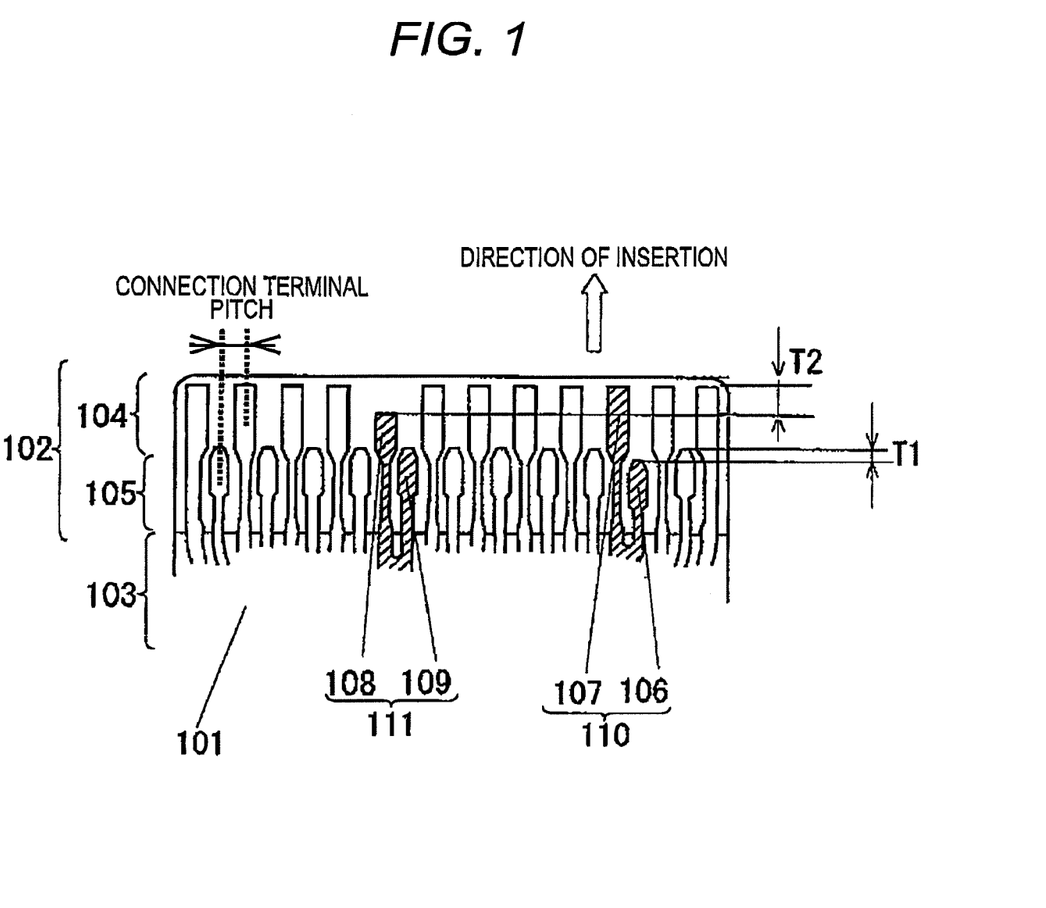
FIG. 1 is a structural view of a connector terminal of a wiring board of an embodiment of the present invention.

FIG. 1 is a structural view of a connection terminal of a wiring board of an embodiment of the present invention.

As shown in FIG. 1, a wiring board 101 has a terminal section 102 and a wiring section 103 connected to the terminal section 102. The terminal section 102 is configured such that a plurality of long connection terminals 104 are spaced at predetermined intervals along a direction orthogonal to a direction in which the terminal section 102 is to be inserted (a direction of insertion) and that short connection terminals 105 sandwiched between adjacent long connection terminals 104 are positioned at the rear of the adjacent long connection terminals with respect to the direction of insertion. The terminal section 102 also has a first short-circuit connection terminal 110 in which at least one adjacent pair consisting of a long connection terminal 107 and a short connection terminal 106 are short-circuited and in which the thus-short-circuited short connection terminal 106 is made shorter than non-short-circuit short connection terminals.

In FIG. 1, the short connection terminal 106 and the long connection terminal 107 are short-circuited, and the short connection terminal 106 is made shorter than the non-short-circuit short connection terminals by T1.

The terminal section 102 further has a second short-circuit connection terminal 111 in which at least one adjacent pair consisting of a long connection terminal 108 and a short connection terminal 109 are short-circuited and in which the thus-short-circuited long connection terminal 108 is made shorter than the non-short-circuit long connection terminals by T2.

An interval between the long connection terminals 104 is about 0.5 mm. The short connection terminal 105 is situated at a substantially-center position between and at the rear of the long connection terminals 104 with respect to the direction of insertion. Such an arrangement is often called a staggered arrangement.

The long connection terminals 104 and the short connection terminals 105, which are adjacent to each other, are alternately arranged. A connection terminal pitch that is a distance between the centers of adjacent connection terminals is set so as to fall within a range of; for instance, 0.1 mm to 0.5 mm.

So long as the long connection terminals 104 and the short connection terminals 105 are plated; for instance, gold-plated, the connection section will not be oxidized, whereby the reliability of an electrical connection between the wiring board 101 and the connector can be enhanced.

FIG. 2 is a schematic diagram of a connector terminal to which the wiring board of the embodiment of the present invention is connected.

As shown in FIG. 2A, each of electrodes 202 of a connector 201 to which the wiring board 101 is inserted has a connection section 203.

The electrodes 202 are alternately arranged on an insertion side and an electronic-device-circuit side of the connector with respect to the direction of insertion of the wiring board such that the electrodes 202 on the insertion side are connected to the long connection terminals 104 on the insertion side of the wiring board 101 and that the electrodes 202 on the electronic-device-circuit side are connected to the short connection terminals 105 on a wiring side. In short, there are arranged the connection sections 203 that are connected in correspondence with the long connection terminals 104 and the short connection terminals 105 of the wiring board 101.

Figure 3:
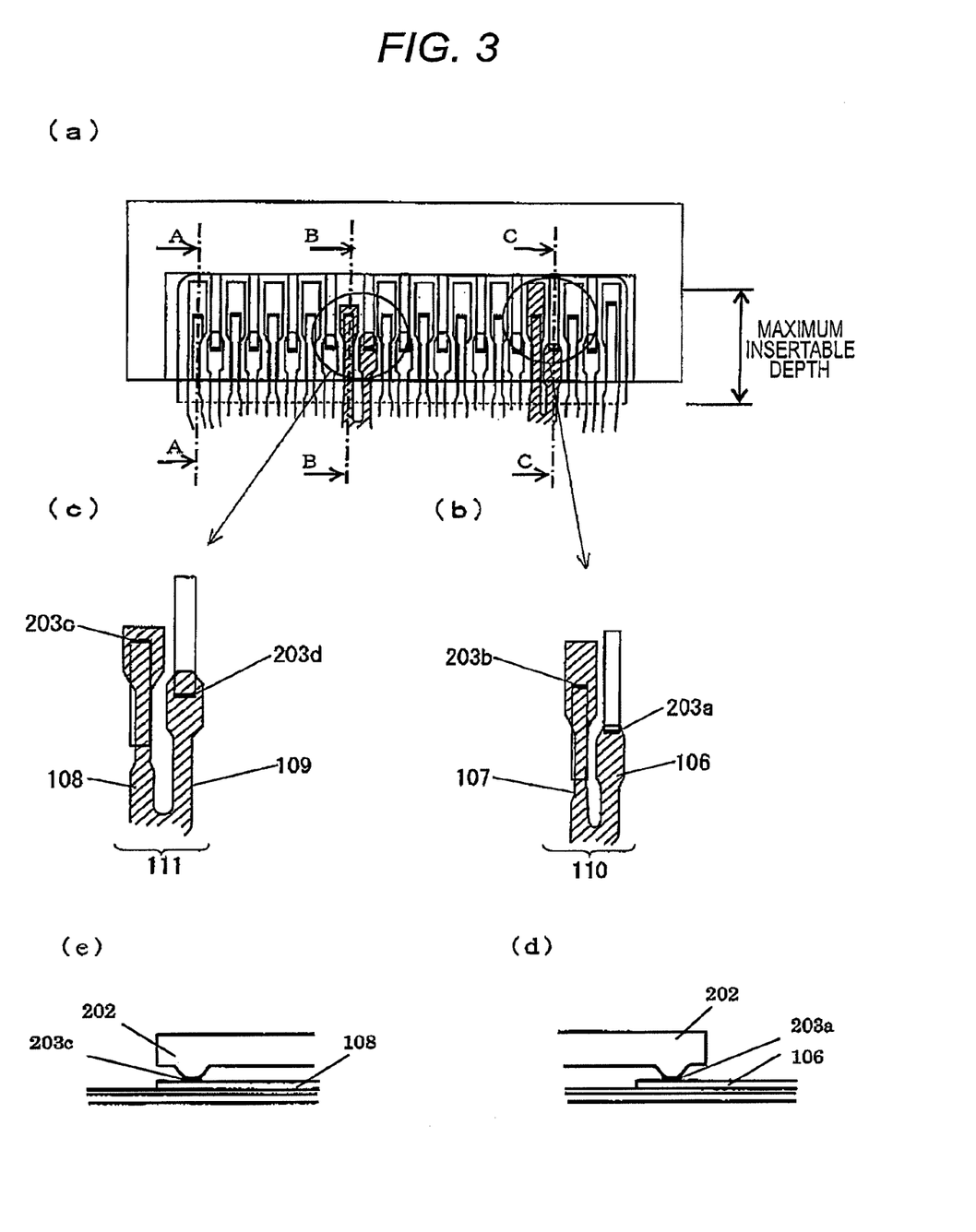
FIG. 3 is a view showing a state of the wiring board of the embodiment of the present invention being connected to a connector.

FIG. 2B is a partially-enlarged view of a cross section (a side surface) taken along line A-A shown in FIG. 3A.

As is obvious from the drawing, when inserted to the connector 201, the long connection terminal 104 of the wiring board 101 is electrically connected to the connection section 203 of the electrode 202 of the connector 201.

In order to insert the wiring board 101 into the connector 201, an extremity of the wiring board 101 in the direction of insertion is inserted so as to contact a depth section 204 of the connector 201.

A length from an insertion-side end surface of the connector 201 to the depth section 204 achieved in the direction of insertion is equivalent to the maximum depth (see FIG. 3A) to which the wiring board 101 can be inserted to the connector 201 and set to a range from; for instance, 1.0 mm to 4.0 mm.

Each of the electrodes 202 of the connector 201 has a connection line 211 connected to the electronic device circuit side of the connector 201.

FIG. 3 is a view showing a state in which the wiring board of the embodiment of the present invention is connected to the connector.

FIG. 3A is a view in which the wiring board 101 is normally inserted to the connector 201 without involvement of inclination. FIG. 3B is an enlarged view showing an inserted state of the first short-circuit connection terminal 110. FIG. 3C is an enlarged view showing an inserted state of the second short-circuit connection terminal 111.

As shown in FIGS. 3B and 3C, when the wiring board 101 is normally inserted into the connector 201 without involvement of inclination, the short connection terminal 106 of the first short-circuit connection terminal 110 is normally connected to a connection section 203a of the electrode 202 of the connector 201, and the long connection terminal 107 is normally connected to a connection section 203b of the electrode 202 of the connector 201.

Moreover, the short connection terminal 109 of the second short-circuit connection terminal 111 is normally connected to a connection section 203d of the electrode 202 of the connector 201, and the long connection terminal 108 is normally connected to a connection section 203c of the electrode 202 of the connector 201.

FIG. 3D is a partially-enlarged view of a cross section (a side surface) taken along line C-C shown in FIG. 3A.

As is evident from the drawing, the long connection terminal 106 of the wiring board 101 is electrically connected to the connection section 203a of the electrode 202 of the connector 201.

FIG. 3E is a partially-enlarged view of a cross section (a side surface) taken along line B-B shown in FIG. 3A.

As is obvious from the drawing, the long connection terminal 108 of the wiring board 101 is electrically connected to the connection section 203C of the electrode 202 of the connector 201.

Accordingly, the study of conduction and electrical resistance between the electrodes in each of the connection sections 203a and 203b and the study of conduction and electrical resistance between the electrodes in each of the connection sections 203c and 203d show that the short-circuit connection terminals are reliably connected together by means of normal connection.

Figure 4:
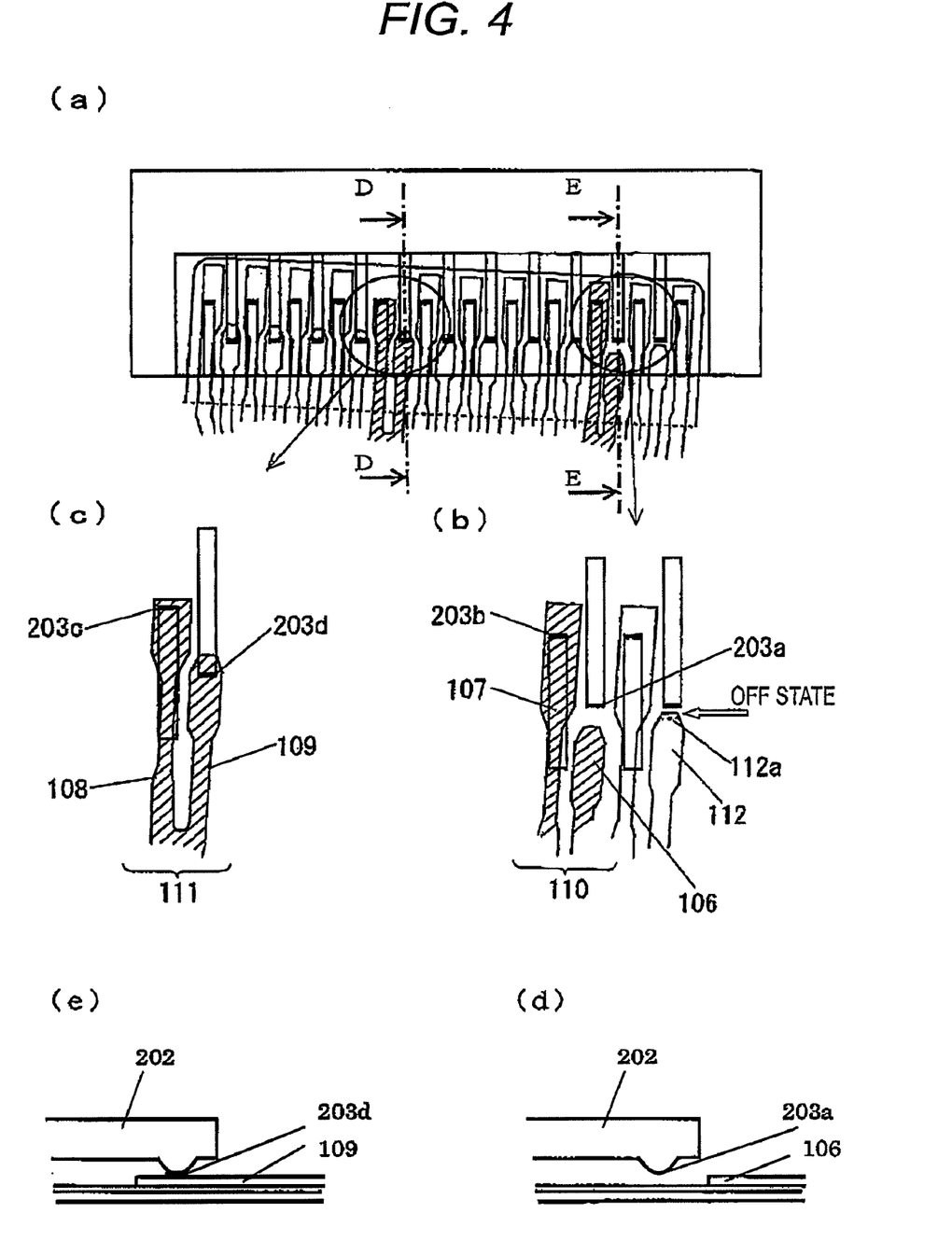
FIG. 4 is a view showing a state in which the wiring board of the embodiment of the present invention is connected to the connector while remaining inclined clockwise.

FIG. 4 is a view showing a state in which the wiring board of the embodiment of the present invention is connected to the connector while inclined clockwise.

FIG. 4A is a view showing that the wiring board 101 is inserted into the connector 201 while inclined rightward. FIG. 4B is an enlarged view showing an inserted state of the first connection short-circuit terminal 110, and FIG. 4C is an enlarged view showing an inserted state of the second connection short-circuit terminal 111.

So long as the first short-circuit connection terminal 110 and the second short-circuit connection terminal 111 are arranged at respective ends of the connection terminals arranged in a direction orthogonal to a direction in which the wiring board 101 is inserted into the connector 201, inclination of the wiring board can be readily determined. However, it may be the case where the first and second short-circuit connection terminals cannot be placed at both ends of the connection terminals depending on a circuit configuration. For this reason, there is adopted a configuration that enables detection of an inclination even when the connection terminals of the wiring board 101 cannot be placed at both ends.

As shown in FIG. 4B, when the wiring board 101 is inserted into the connector 201 while being inclined clockwise, the first short-circuit connection terminal 110 is not connected to the connection section 203a of the electrode 202 of the connector 201. The rightmost short connection terminal 112 of the wiring board 101 falls within the maximum dimensional tolerance; for instance, when the rightmost short connection terminal corresponds to; for instance, the short connection terminal 112a, the essential requirement is to determine the length T1 such that the position of the leading end of the short connection terminal 106 becomes shorter than the non-short-circuit connection terminals so as to prevent establishment of electrical conduction between the short connection terminal 106 of the first short-circuit connection terminal 110 and the connection section 203a of the connector 201.

FIG. 4D is a partially-enlarged view of a cross section (a side surface) taken along line E-E shown in FIG. 4A.

As is evident from the drawing, the long connection terminal 106 of the wiring board 101 is spaced apart from the connection section 203a of the electrode 202 of the connector 201, and hence electrical connection is not established.

As shown in FIG. 4C, when the wiring board 101 is inserted into the connector 201 while being inclined clockwise, the long connection terminal 108 of the second short-circuit connection terminal 111 and the connection section 203c of the electrode 202 of the connector 201 are normally connected. The short connection terminal 109 of the second short-circuit connection terminal 111 and the connection section 203d of the connector 201 are also connected normally.

FIG. 4E is a partially-enlarged view of a cross section (a side surface) taken along line D-D shown in FIG. 4A.

As is obvious from the drawing, the long connection terminal 109 of the wiring board 101 is electrically connected to the connection section 203d of the electrode 202 of the connector 201.

Accordingly, the study of conduction and electrical resistance between the electrodes in each of the connection sections 203c and 203d enables ascertainment of a connected state, and it is possible to determine whether or not the electrodes are reliably connected.

As a consequence, if the first short-circuit connection terminal 110 is in a state of faulty connection and if the second short-circuit connection terminal 111 is connected, it will be possible to determine that the direction of insertion is rotated rightward. The direction of insertion can be corrected on the basis of a result of determination.

Figure 5:
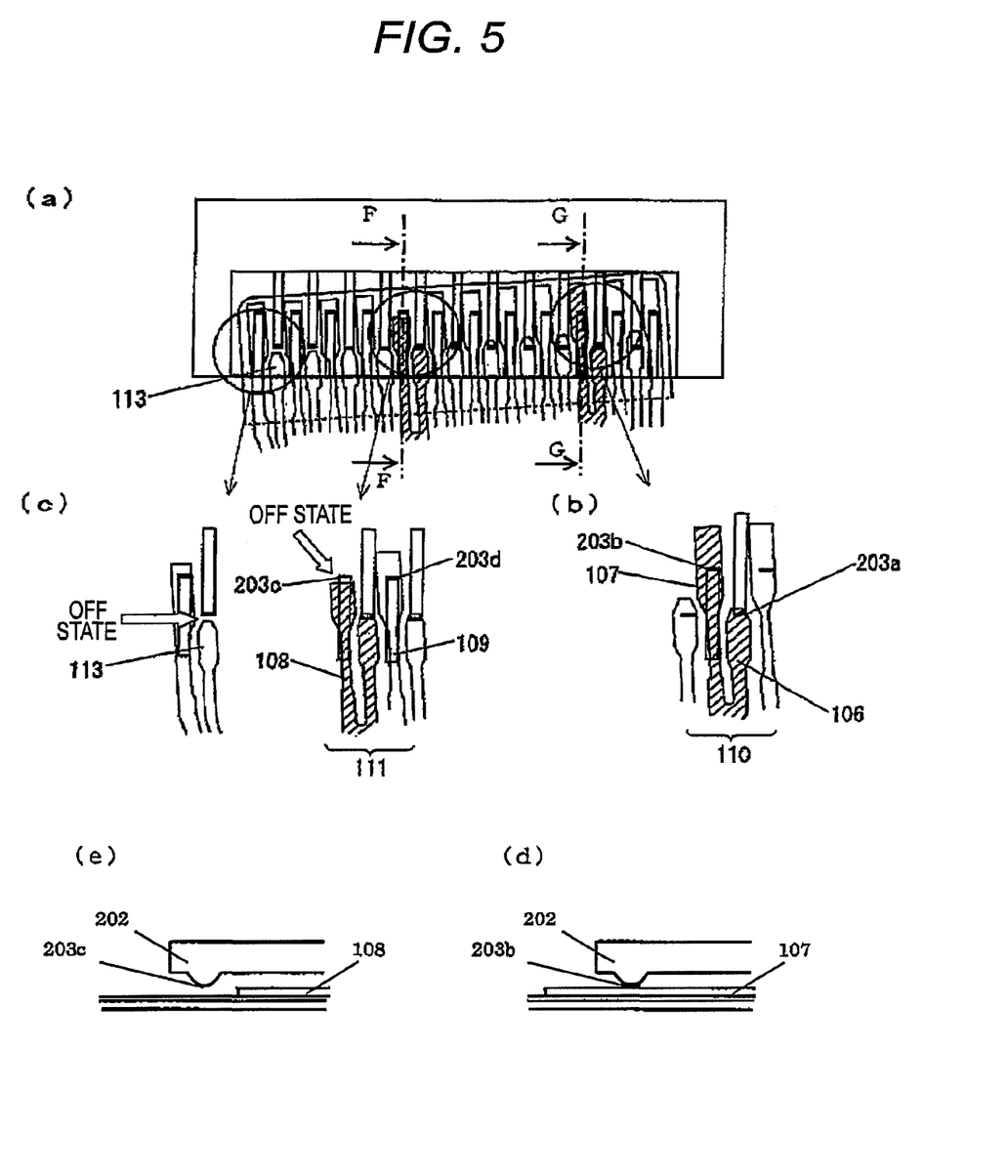
FIG. 5 is a view showing a state in which the wiring board of the embodiment of the present invention is connected to the connector while remaining inclined counter clockwise.

FIG. 5 is view showing that the wiring board of the embodiment of the present invention is connected to the connector while being inclined counterclockwise.

FIG. 5A is a view showing that the wiring board 101 is inserted into the connector 201 while being inclined counterclockwise. FIG. 5B is an enlarged view achieved in the inserted state of the first short-circuit connection terminal 110. FIG. 5C is an enlarged view achieved in the inserted state of the second short-circuit connection terminal 111.

As shown in FIG. 5B, when the wiring board 101 is inserted into the connector 201 while being inclined counterclockwise, the short connection terminal 106 of the first short-circuit connection terminal 110 and the connection section 203a of the electrode 202 of the connector 201 are connected. Further, the long connection terminal 107 of the first short-circuit connection terminal 110 and the connection section 203b of the connector 201 are also connected together; hence, the connection section 203a and the connection section 203b are in an electrically-conducted state.

FIG. 5D is a partially-enlarged view of a cross section (a side surface) taken along line G-G shown in FIG. 5A.

As is obvious from the drawing, the long connection terminal 107 of the wiring board 101 is electrically connected to the connection section 203b of the electrode 202 of the connector 201.

As is shown in FIG. 5C, when the wiring board 101 is inserted into the connector 201 while being inclined counterclockwise, the long connection terminal 108 of the second short-circuit connection terminal 111 and the connection section 203c of the connector 201 are not connected together (an OFF state). The short connection terminal 109 of the second short-circuit connection terminal 111 and the connection section 203d of the connector 201 are connected together. Accordingly, so long as electrical conduction of the connection section 203c and the connection section 203d of the connector 201 are reviewed, they are not in electrical conduction.

FIG. 5E is a partially-enlarged view of a cross section (a side surface) taken along line F-F shown in FIG. 5A.

As is evident from the drawing, the long connection terminal 108 of the wiring board 101 is spaced apart from the connection section 203c of the electrode 202 of the connector 201; hence, they are not electrically connected together.

The long connection terminal 108 of the second short-circuit connection terminal 111 is shorter than the non-short-circuit long connection terminals by T2.

It is better to determine the length of T2 in such a way that the leftmost short connection terminal 113 can determine faulty connection when the leftmost short connection terminal 113 in the drawing has come to the maximum dimensional tolerance value; namely, has fallen within a predetermined rotation allowance range, for instance, has rotated through five degrees.

Consequently, so long as the second short-circuit connection terminal 111 is in a state of connection failure and the first short-circuit connection terminal 110 is connected, it becomes possible to determine that the direction of insertion is turned counterclockwise. The direction of insertion can be corrected on the basis of a result of determination.

Figure 6:
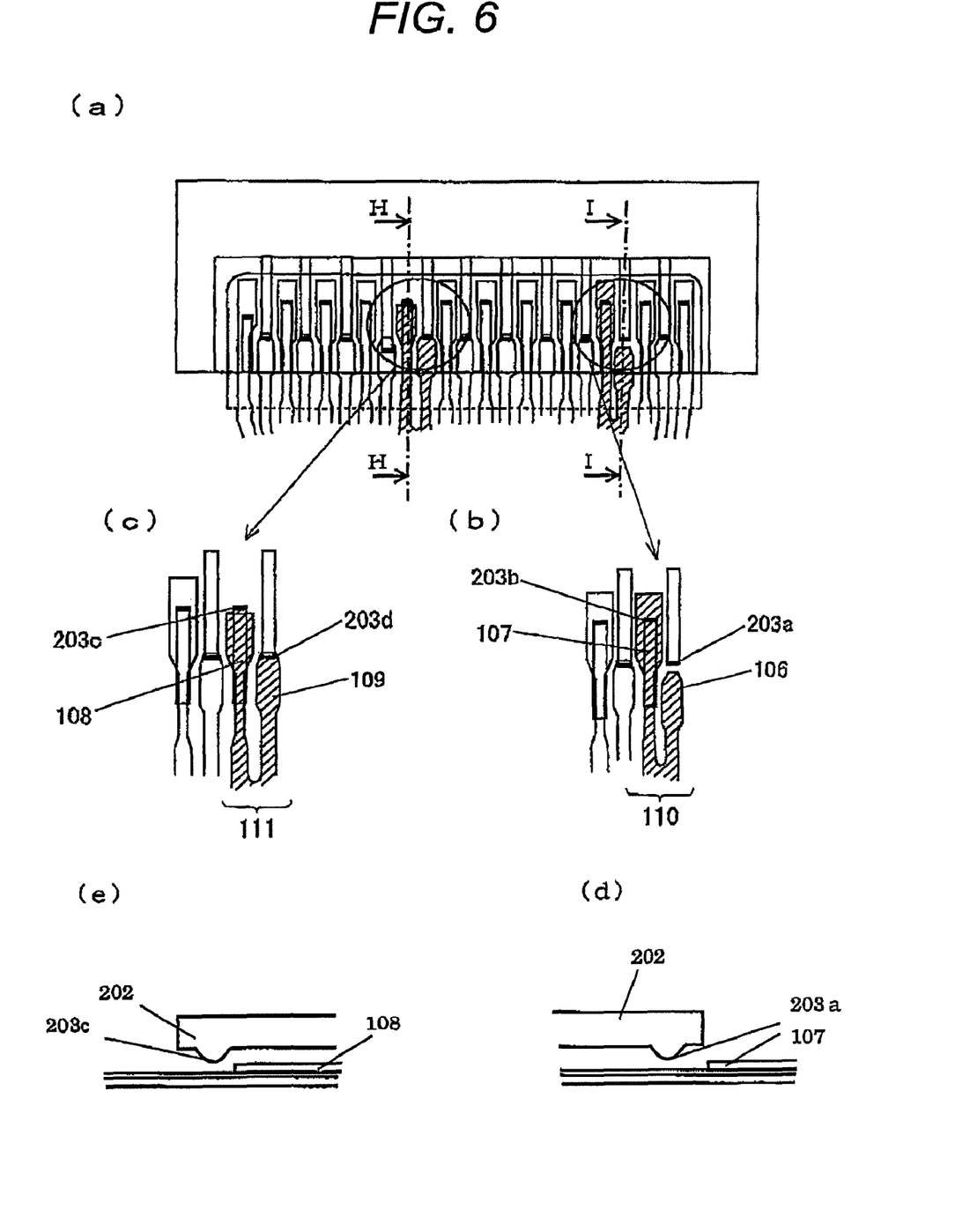
FIG. 6 is a view showing a state in which the wiring board of the embodiment of the present invention is attached while insufficiently inserted into the connector.

FIG. 6 is a view showing that the wiring board of the embodiment of the present invention is insufficiently inserted into the connector.

FIG. 6A is a view showing that the wiring board 101 is insufficiently inserted into the connector. FIG. 6B is an enlarged view achieved in an inserted state of the first short-circuit connection terminal 110. FIG. 6C is an enlarged view achieved in an inserted state of the second short-circuit connection terminal 111.

As shown in FIG. 6B, the short connection terminal 106 of the first short-circuit connection terminal 110 is shorter than the other non-short-circuited short connection terminals. Hence, the drawing shows that, when the wiring board 101 is insufficiently inserted into the connector, the short connection terminal 106 of the first short-circuit connection terminal 110 and the connection section 203a of the electrode 202 of the connector 201 come into an unconnected state.

Moreover, the long connection terminal 107 of the first short-circuit connection terminal 110 is equal in length to the other non-short-circuited short connection terminals. Hence, even when the wiring board 101 is insufficiently inserted into the connector in a like manner, the long connection terminal 107 is in connection with the connection section 203b of the connector 201.

Accordingly, electrical conduction of the connection section 203a and the connection section 203b of the connector 201 is detected. If conduction is detected, the connection section 203a and the connection section 203b are electrically connected by way of the first short-circuit connection terminal 110. Consequently, the extent to which the wiring board 101 is inserted into the connector can be determined not to be insufficient. If the detected state is a non-conducting state, it can be determined that the connection section 203a of the electrode 202 is spaced apart from the short connection terminal 106 as illustrated in the drawing, so that the wiring board 101 is not sufficiently inserted into the connector 201.

As shown in FIG. 6C, when the wiring board 101 is insufficiently inserted into the connector 201, the long connection terminal 108 of the second short-circuit connection terminal 111 and the connection section 203c of the electrode 202 of the connector 201 are not connected together. Further, the short connection terminal 109 of the second short-circuit connection terminal 111 is connected to the connection section 203d of the connector 201. Therefore, a state of non-conduction between electrodes can be determined by detection of electrical conduction of the connection section 203c and electrical conduction of the connection section 203d of the connector.

FIG. 6D is a partially-enlarged view of a cross section (a side surface) taken along line I-I shown in FIG. 6A.

FIG. 6E is a partially-enlarged view of a cross section (a side surface) taken along line H-H shown in FIG. 6A.

As is obvious from the drawing, the long connection terminal 108 of the wiring board 101 is spaced apart form the connection section 203c of the electrode 202 of the connector 201; hence they are not electrically connected together.

As mentioned above, when the state of electrical conduction between the electrodes of the first short-circuit electrode 110 and the state of conduction between the electrodes of the second short-circuit connection terminal 111 are the state of non-conduction, insufficient insertion is determined. Therefore, the extent of insertion can be corrected.

Figure 7:
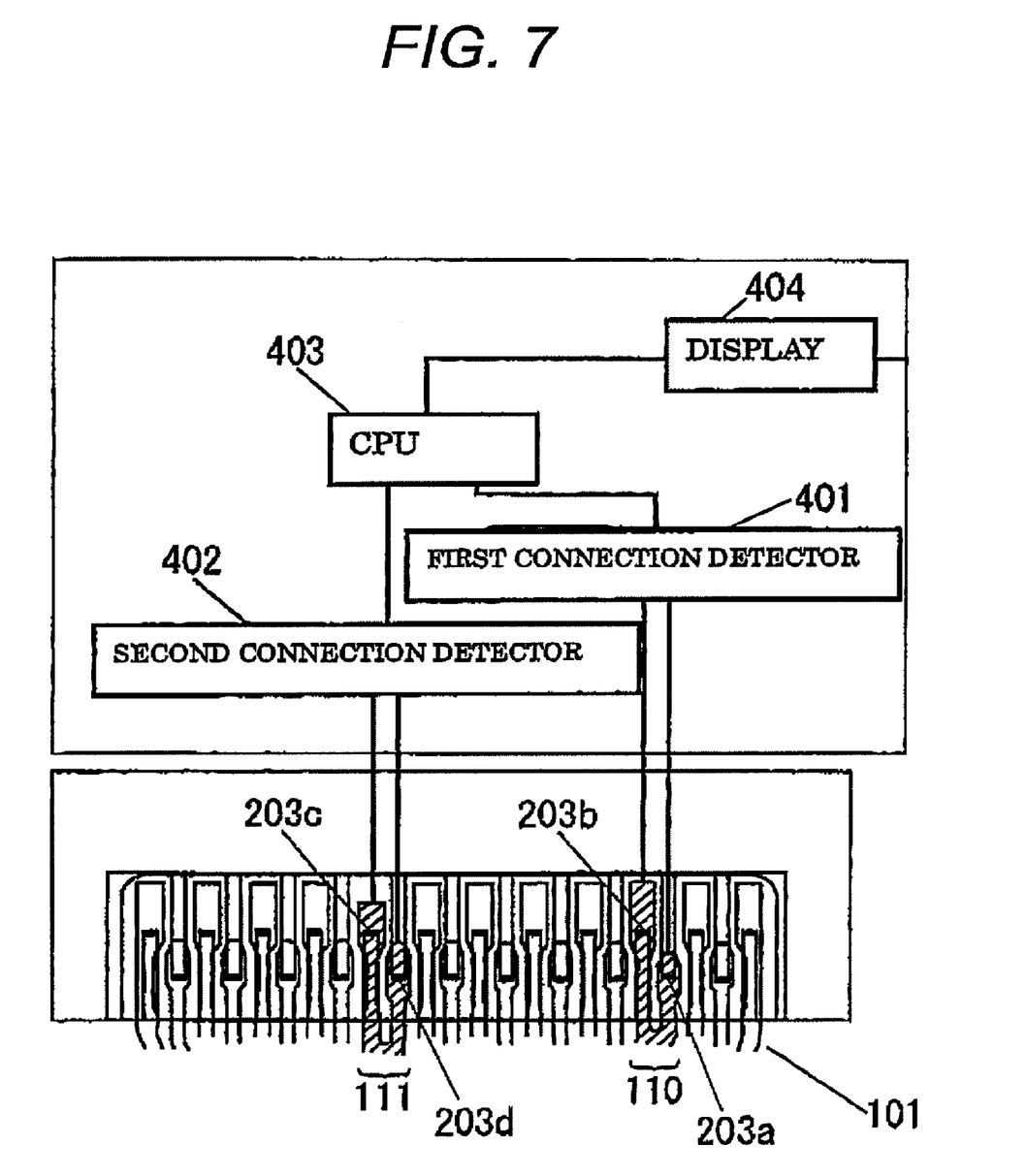
FIG. 7 is a block diagram of an erroneous connection determination device of the embodiment of the present invention.

FIG. 7 is a block diagram of an erroneous connection detector of the embodiment of the present invention.

In FIG. 7, first connection termination means 401 is connected to the connection section 203a of the electrode 202 of the connector 201 that is to be connected to the short connection terminal 106 of the first short-circuit connection terminal 110 and the connection section 203b of the electrode 202 of the connector 201 that is to be connected to the long connection terminal 107 of the first short-circuit connection terminal 110. When the wiring board is inserted into the connector 201, electrical conduction of the connection section 203a and the connection section 203b of the connector 201 are ascertained, whereupon a determination is made as to whether or not connection has been established.

Second connection termination means 402 is connected to the connection section 203d of the electrode 202 of the connector 201 that is to be connected to the short connection terminal 109 of the second short-circuit connection terminal 111 and the connection section 203c of the electrode 202 of the connector 201 that is to be connected to the long connection terminal 108 of the first short-circuit connection terminal 111. When the wiring board is inserted into the connector 201, electrical conduction of the connection section 203c and the connection section 203d of the connector 201 are ascertained, whereupon a determination is made as to whether or not connection has been established.

An output of the first connection determination means 401 and an output of the second connection determination means 402 are computed by computation means 403, and output means 404 outputs a state of connection.

The computation means 403 performs computation, from determination results from the first connection determination means 401 and the second connection determination means 402, as to which direction inclination exists and as to whether or not insufficient insertion exists.

In relation to computation results, the first connection termination means 401 and the second connection termination means 402, for instance, make determinations, whereby the output means 404 can display the direction of inclination and a state of incomplete insertion. Hence, a connection determination device that is free of connection failures can be provided.

The connection determination device may also be embodied as an device that performs checking during manufacture of a product. However, the connection determination device may also be incorporated, as firmware for an electronic device, such as an optical disk drive, into a product, and may perform determination.

The wiring board 101 of the present invention can be built in an electronic device; for instance, an optical disk drive accommodated in a notebook PC, or an electronic device built in an automobile or a TV set. As a result, faulty connection can be obviated; hence the reliability of a product can be enhanced.

By means of the connection determination device and the wiring board, when faulty connection is caused by large physical vibrations that are not originally envisaged or user's faulty operation, occurrence of faulty connection is readily determined and measures against faulty connection can be taken.

Re-inspection of connections of an assembled product, which would hitherto be performed when an erroneous connection is found after assembly of the product, is prevented by introduction of the erroneous connection determination device into a production process; hence, productivity can be enhanced.

Figure 8:
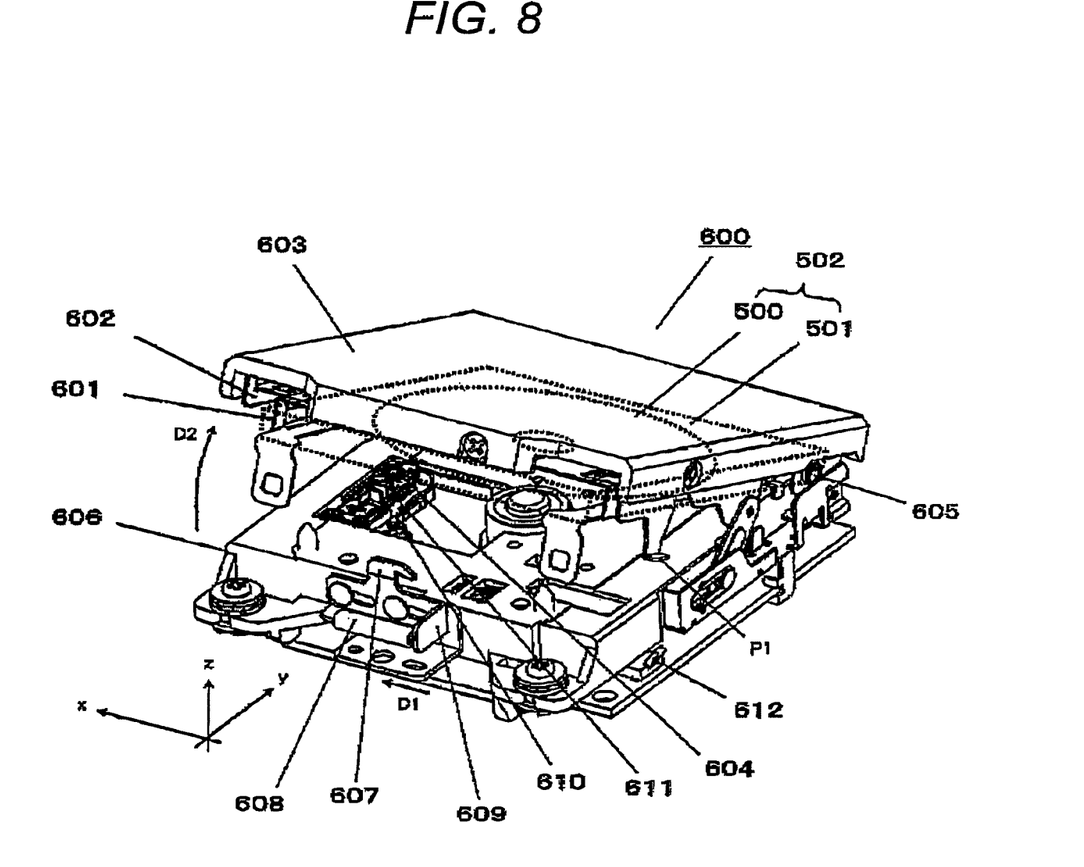
FIG. 8 is a perspective view showing a state in which a top cover of a compact optical disk drive of the present invention is opened.

FIG. 8 is a perspective view showing that a top cover of a compact optical disk drive of the present invention is opened.

In FIG. 8, a small-diameter optical disk having a diameter of about 32 millimeters is used in order to apply a disk-shaped recording medium 500 for mobile application purpose. A cartridge 501 houses the disk-shaped recording medium 500, and an information recording medium 502 is built from the disk-shaped recording medium 500 and the cartridge 501.

The information recording medium 502 is inserted into or removed from an information recording medium storage section 601 of a compact optical disk drive 600 by user's operation. Specifically, the information recording medium 502 is configured so as to be removably attachable to the information recording medium storage section 601 in the compact optical disk drive 600.

A top chassis 602 is supported by the information recording medium storage section 601, and the top chassis 602 supports a top cover 603. A pickup regulation member (not shown) for regulating displacement of the pickup 604 in excess of a normal range is attached to the top chassis 602.

A storage section support 605 serves as a rotation center for opening and closing actions of the information recording medium storage section 601 with respect to a playback mechanism section 606. A hook 607 regulating opening and closing actions is driven by a hook drive member 608. When the information recording medium storage section 601 is closed, the hook 607 is latched by an un-illustrated latch member provided on the top cover 603, whereby the information recording medium storage section 601 is maintained in a closed state.

In the meantime, when the user actuates a top cover release lever 609 in direction D1, the hook 607 is also moved in direction D1 in synchronism with the top cover release lever 609, to thus become disengaged from the un-illustrated latch member provided on the top cover 603. The information recording medium storage section 601, the top chassis 602, and the top cover 603 are displaced in direction D2 while taking the storage section support 605 as a support center, whereby the information recording medium storage section 601 becomes exposed and open.

The user inserts the information recording medium 502 into the exposed information recording medium storage section 601 and presses down the top cover 603 in a direction opposite to direction D2, whereupon the information recording medium storage section 601 moves in the direction opposite to direction D2 along with the top chassis 602 and whereupon the information recording medium storage section 601 becomes closed.

The optical unit 610 is equipped with an optical-system member for reading information of the information recording medium 502 stored in the information recording medium storage section 601, and the member is built from a carriage (not shown) that is supported so as to be able to move along a record surface of the disk-shaped recording medium 500 constituting the information recording medium 502, in the positive or negative direction of the x-axis; namely, in directions toward the center and an outer periphery of the disk-shaped information recording medium 500; a pickup 604 for forming, on the record surface of the disk-shaped recording medium 500, an image from light originating from a light source (not shown); and an actuator 601 for controlling, during reading operation, the position of the pickup 604 in real time and in the positive or negative direction of the Z axis and in the positive or negative direction of the x axis so as to maintain a predetermined positional relationship between the pickup 604 and the record surface.

A storage section open/close detection sensor 612 is built from; for instance, a micro-switch having a lever section. The storage section open/close detection sensor 612 detects open/close state of the information recording medium storage section 601 by utilization of a change in the state of the storage section open/close detection sensor 612 caused by a position P1 in association with opening/closing action of the information recording medium storage section 601.

An output from the storage section open/close sensor 612 is passed to a control section 700 (see FIG. 9) that is configured as circuitry by implementation of various electronic components on a glass epoxy substrate. Upon detection of an open state of the information recording medium storage section 601, the control section 700 perform control operation so as to convey an optical unit 610 equipped with the pickup 604 to a position where a pickup regulation member (not shown) is placed.

Figure 9:
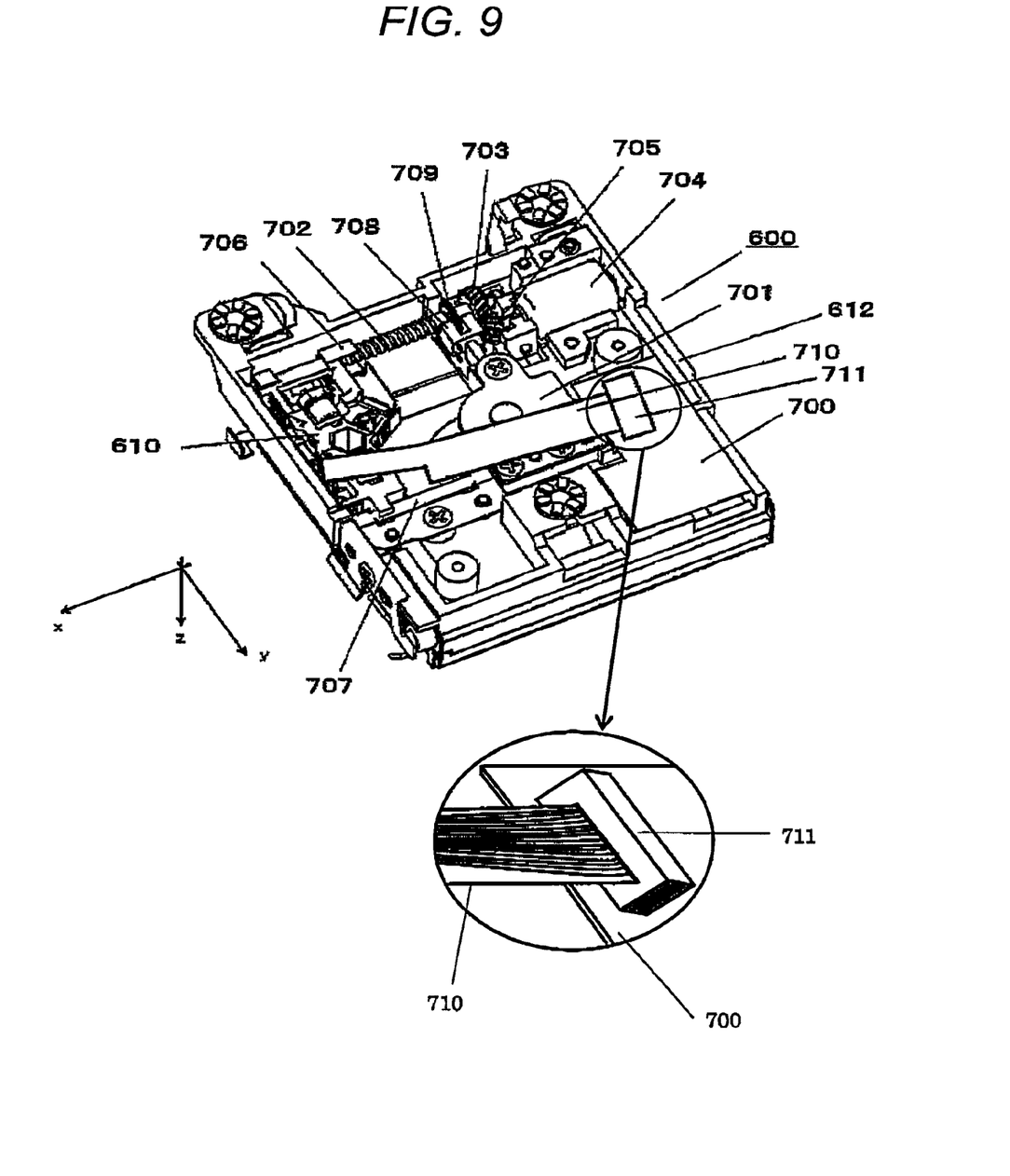
FIG. 9 is a perspective view showing a mechanism of a playback mechanism section of the compact optical disk drive of the present invention.

FIG. 9 is a perspective view showing a mechanism of a playback mechanism section in the compact optical disk drive of the present invention in which the playback mechanism section 606 of FIG. 8 is viewed from a negative direction to a positive direction along the z-axis.

In FIG. 9, the optical unit 610 is a device for reading information recorded in the information recording medium 502 (see FIG. 8) as mentioned above. A spindle motor 701 is built from a brushless motor that serves as a power source for rotationally driving the information recording medium 502.

A lead screw shaft gear 703 is fixed to a lead screw shaft 702 and meshes with a motor gear 705 attached to a rotary shaft of a feed motor 704 serving as a power source, whereby rotational power is transmitted from the feed motor 704 to the lead screw shaft 702.

An outer periphery of the lead screw shaft 702 is threaded, and power is transmitted from the lead screw shaft 702 to the optical unit 610 by means of a rack leaf spring 706, whereupon the optical unit 610 moves in the positive or negative direction of the x-axis; namely, to a position on an inner or outer radius of the information recording medium 502.

A guide shaft 707 regulates and guides operation of the optical unit 610 toward a position along the inner or outer radius of the information recording medium.

As a result of the feed motor 704 being rotationally driven in a predetermined direction by means of the foregoing configuration, resultant drive power is transmitted by way of the motor gear 705, the lead screw shaft gear 703, the lead screw shaft 702, and the rack leaf spring 706, whereupon the optical unit 610 is driven in the positive or negative direction of the x-axis while being guided by the lead screw shaft 702 and the guide shaft 707.

Moreover, a photo-interrupter 708 serving as an optical sensor detects presence or absence of slits formed along an outer periphery of a disk-shaped slit plate 709 provided at an extension of an axis of the lead screw shaft 702, thereby measuring the number of rotations of the lead screw shaft 702.

The above-mentioned mechanical operation is controlled by the control section 700 that is configured as circuitry by implementation of various electronic components on the glass epoxy substrate. The control section 700 is equipped with, as hardware, work memory built from a CPU and RAM, nonvolatile program memory built from ROM, and nonvolatile memory built from EEPROM for storing the status of the optical disk drive 600, (all of which are not illustrated) which process at least an output from the photo-interrupter 708, to thus count the slits of the slit plate 709, which output a drive signal for rotating the feed motor 704 in a forward or backward direction, and which ascertain an open or closed state of the information recording medium storage section 601 (see FIG. 8) from an output from the storage section open/close detection sensor 612 (see FIG. 8).

A range of movement of the optical unit 610 in the direction of the x-axis is mechanically determined beforehand. Hence, the control section 700 conveys the optical unit 610 in; for instance, the positive direction of the x-axis (i.e., toward the outer radius of the information recording medium 502), such that a slit count value pertaining to the slit plate 709 produced by the photo-interrupter 708 comes to a predetermined number (so as to exceed the foregoing range of movement), the optical unit 610 in due course reaches the outermost end of the movement range.

Even when the lead screw shaft 702 is rotated in this state, the rack leaf spring 706 comes off a groove formed in the lead screw shaft 702. Hence, undue stress is not exerted on the optical unit 610 in the positive direction of the x-axis, and the optical unit 610 is placed at the outermost edge of the range where the unit can move.

The outermost edge in the positive direction of the x-axis in which the optical unit 610 can move is taken as a home position at the time of conveyance of the optical unit 610. The control section 700 can drive the feed motor 704 in the positive or negative direction. Hence, after the home position has been determined as mentioned above, the control section 700 measures the number of rotations of the lead screw shaft 702 from a result of detection of the slits on the slit plate 709 performed by the photo-interrupter 708, so that the optical unit 610 can be conveyed to an arbitrary position in the direction of the x-axis.

By means of the function, upon detection of the open state of the information recording medium storage section 601, the control section 700 can perform control operation such that the optical unit 610 equipped with the pickup 604 is conveyed to a location where the pickup regulation member is placed.

A drive current for driving an actuator 611, which will be descried in detail later, is supplied from the connector 711 implemented in the control section 700 to the optical unit 610 by way of the wiring board 710 having the foregoing configuration of the present invention.

Figure 10:
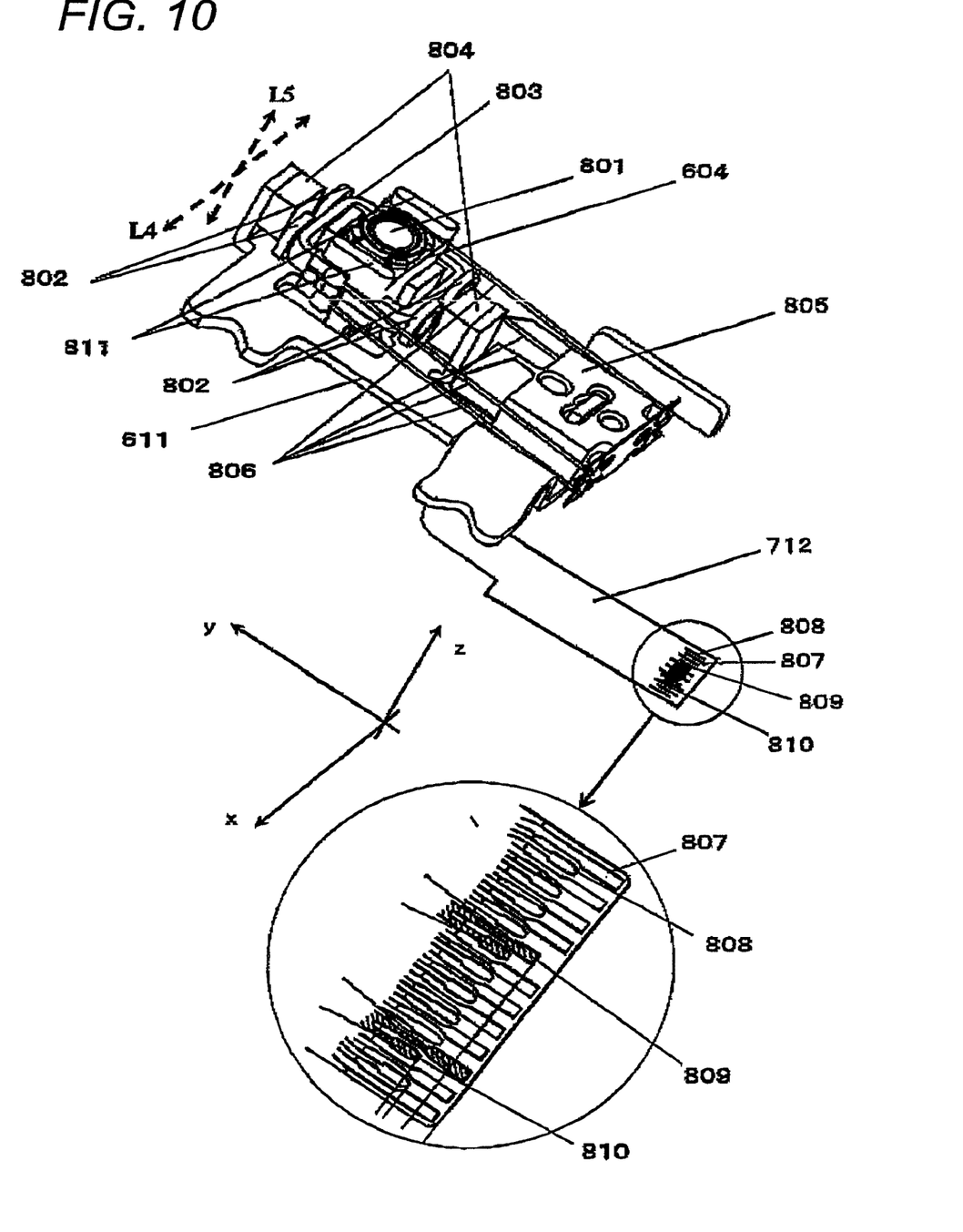
FIG. 10 is a perspective view showing the structure of an actuator of the compact optical disk drive of the present invention.

FIG. 10 is a perspective view showing the structure of the actuator of the compactor optical disk drive of the present invention.

By reference to FIG. 10, there are described the structure of the actuator 611 constituting the principal section of the optical unit 610 and a configuration for displacing the location of the pickup 604 by means of the structure.

Although the pickup 604 shown in FIG. 10 has already been briefly described, the pickup 604 directly supports the objective lens 801. Four tracking coils 802 and one focusing coil 803 are disposed along an outer periphery of the pickup 604. The tracking coils 802 and the focusing coil 803 are situated in a magnetic circuit constituted of permanent magnets 804 placed on the actuator 611.

The pickup 604 is supported in midair by four suspension wires 806. The suspension wires 806 are fastened to a suspension holder 805 located on an actuator 611 and are formed from beryllium copper. Each of the suspension wires has a length of eight millimeters and a thickness of 50 micrometers. An electric current is supplied to the four tracking coils 802 by way of the suspension wires 806, whereby the objective lens 801 is minutely displaced in direction L4 along the positive or negative direction of the x-axis, Likewise, a drive current is supplied to the focusing coil 803, whereby the objective lens 801 is minutely displaced in direction L5 along the positive or negative direction of the z-axis.

The wiring board 710, such as a flexible printed board (FPC), of the present invention is connected to the actuator 611. As mentioned previously, a drive current is supplied from the connector 711 implemented in the control section 700 by way of the wiring board 710 to the actuator 611 constituting the optical unit 610.

A plurality of long connection terminals 807 and a plurality of short connection terminals 808 are alternately arranged in a staggered pattern along the extremity of the wiring board 710 as mentioned previously. At least one adjacent pair consisting of a long connection terminal 809 and a short connection terminal 810 are short-circuited. Further, the thus-short-circuited long connection terminal 809 is made shorter than the non-short-circuit long connection terminal 807, or the short-circuited short connection terminal 810 is made shorter than the non-short-circuit short connection terminal 808.

The connection terminals 807, 808, 809, and 810 formed at the extremity are inserted into the connector 711 implemented in the control section 700. Connection terminals of the wiring board 710 are connected to corresponding electrodes of the connector 711 so as to establish electrical conduction. A drive current necessary to drive the tracking coils 802 and the focusing coil 803 constituting the optical unit 610 is supplied from the control section 700.

In the process for producing the compact optical disk drive 600, in order to determine the state of connection between the wiring board 710 and the connector 711, there is used a connection detection method comprising: bringing a probe in contact with electrodes of the connector 711 corresponding to the short-circuited long connection terminal 809 and the short-circuited short connection terminal 810 of the wiring board 710 from the outside by way of wires of the control section 700, to thus measure the state of conduction between the electrodes; and applying, for instance, a DC voltage 5.0V between the electrodes by way of a fixed resistor, to thus determine that, when a conduction current of 100 μA or more does not flow, the wiring board and the connector are in a non-conducted state; namely, an erroneously-connected state.

As mentioned previously, in order to miniaturize the compact optical disk drive 600, a connection terminal pitch of the wiring board 710 is set so as to fall within a range from 0.1 mm to 0.5 mm, thereby making the pitch narrow. In addition, the maximum depth that allows insertion of the wiring board into the connector 711 is also set so as to fall within a range from 1.0 mm to 4.0 mm.

Accordingly, when the wiring board 710 is inserted into the connector 711 nominally insufficiently or at nominal inclination, there arises a problem of difficulty in assuring a normally connected state. However, the foregoing erroneous connection detection method makes it to easily determine whether or not a normal drive current is supplied from the control section 700 to the optical unit 610 by way of the wiring board 710 of the present invention. Hence, even in such a circumstance, selection or correction work becomes facilitated, and enhanced productivity can be attained.

Moreover, as shown in FIGS. 9 and 10, the optical-unit-610 side of the wiring board 710 is made smaller in width than the control-section-700 side of the wiring board 710, whereby load on the optical unit 610 resultant from movement is lessened, and the optical unit can be accurately conveyed to an arbitrary position.

Since the wiring board 710 is implemented on a side of the optical unit 610 where the objective lens 801 is not positioned, a laser beam radiated from the objective lens 801 to the disk-shaped recording medium 500 is not hindered. Accordingly, stable recording operation and playback operation can be achieved.

Further, projection sections 811 are provided in the vicinity of the objective lens 801 of the pickup 604 and formed at least from an elastic resin that is softer than the disk-shaped recording medium 500 (see FIG. 8). The projection sections 811 are formed so as to protrude beyond the objective lens 801 in the positive direction of the x-axis.

As mentioned above, the wiring board of the present invention and the optical disk drive using the same enable elimination of faulty connection between a wiring board with a staggered pattern and connectors of a circuit board. Hence, the optical disk drive can be utilized as a miniaturized, highly-packed optical disk drive.

This application claims the benefit of Japanese Patent application No. 2008-67530 filed on Mar. 17, 2008, the entire contents of which are incorporated herein by reference.

What is claimed is:

1. A wiring board connected to a connector through insertion, comprising:
  a plurality of connection terminals arranged at predetermined intervals on the wiring board and that are electrically connected to electrodes of the connector corresponding to the respective connection terminals when the wiring board is inserted into the connector, wherein the plurality of connection terminals include a plurality of first connection terminals, a second connection terminal provided between the plurality of first connection terminals and positioned at a rear of the plurality of first connection terminals with respect to a direction of the insertion, a third connection terminal that is adjacent to the second connection terminal and is shorter than the plurality of first connection terminals, and a fourth connection terminal that is adjacent to one of the plurality of first connection terminals and is shorter than the second connection terminal;

either the one of the plurality of first connection terminals or the second connection terminal is short-circuited with the third connection terminal; and the one of the plurality of first connection terminals or the second connection terminal that is not short-circuited with the third connection terminal is short-circuited with the fourth connection terminal.

2. An optical disk drive in which a drive current is supplied from a controller to an optical unit by the wiring board and the connector defined in claim 1.

3. The optical disk drive according to claim 2, wherein the wiring board is implemented in the optical unit; the control section is implemented in the connector; and the wiring board is inserted and connected to the connector.

4. An optical disk drive that supplies a drive current form a controller to an optical unit by way of a wiring board and a connector, the drive comprising:

a plurality of connection terminals arranged at predetermined intervals on the wiring board; and a plurality of electrodes that are provided on the connector and that contact the respective corresponding connection terminals, to thus create pairs, when the wiring board is inserted into the connector, so that the wiring board and the connector are electrically connected, wherein the plurality of connection terminals include a plurality of first connection terminals, a second connection terminal provided between the plurality of first connection terminals and positioned at a rear of the plurality of first connection terminals with respect to a direction of the insertion, a third connection terminal that is adjacent to the second connection terminal and is shorter than the plurality of first connection terminals, and a fourth connection terminal that is adjacent to one of the plurality of first connection terminals and is shorter than the second connection terminal;

either the one of the plurality of first connection terminals or the second connection terminal is short-circuited with the third connection terminal; and the one of the plurality of first connection terminals or the second connection terminal that is not short-circuited with the third connection terminal is short-circuited with the fourth connection terminal.

5. The wiring board according to claim 1, wherein the third connection terminal and the fourth connection terminal sandwich a center of the wiring board, the second connection terminal and the third connection terminal are short-circuited, and the one of the plurality of first connection terminals and the fourth connection terminal are short-circuited.

6. The optical disk drive according to claim 2, further comprising:

a first connection determiner, connected to the one of the plurality of first connection terminals and the fourth connection terminal, when the wiring board is inserted into the connector, that detects electrical conduction of the one of the plurality of first connection terminals and the fourth connection terminal, and determines whether or not a connection has been established, and a second connection determiner, connected to the second connection terminal and the third connection terminal, when the wiring board is inserted into the connector, that detects electrical conduction of the second connection terminal and the third connection terminal, and determines whether or not a connection has been established.

7. The optical disk drive according to claim 4, wherein the third connection terminal and the fourth connection terminal are arranged so as to sandwich a center of the wiring board, the second connection terminal and the third connection terminal are short-circuited, and the one of the plurality of first connection terminals and the fourth connection terminal are short-circuited.

* * * * *